(12) United States Patent
Kim et al.

(10) Patent No.: US 10,732,129 B2
(45) Date of Patent: Aug. 4, 2020

(54) APPARATUS FOR AND METHOD OF PERFORMING INSPECTION AND METROLOGY PROCESS

(71) Applicant: SAMSUNG ELECTRONICS CO., LTD., Suwon-si, Gyeonggi-do (KR)

(72) Inventors: Kwang Soo Kim, Pyeongtaek-si (KR); Youngkyu Park, Incheon (KR); Sungho Jang, Hwaseong-si (KR); Byeonghwan Jeon, Yongin-si (KR)

(73) Assignee: SAMASUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/250,378

(22) Filed: Jan. 17, 2019

(65) Prior Publication Data

US 2019/0376908 A1    Dec. 12, 2019

(30) Foreign Application Priority Data

Jun. 8, 2018 (KR) .................. 10-2018-0066385

(51) Int. Cl.
*G01N 21/956* (2006.01)
*G03F 7/20* (2006.01)

(52) U.S. Cl.
CPC ....... *G01N 21/956* (2013.01); *G03F 7/70141* (2013.01); *G03F 7/70625* (2013.01)

(58) Field of Classification Search
CPC .......... G01J 3/02; G01J 3/0205; G01J 3/0218; G01J 3/0229; G01J 3/0251; G01J 3/0264; G01J 3/10; G01J 3/2803; G01J 3/508; G01J 3/51; G01J 3/513; G01J 2003/1213; G01J 2003/2869; G01J 3/0262; G01J 3/04; G01J 3/46; G01J 3/50; G01J 3/524; G01J 1/0407; G01J 1/0433; G01J 1/0437; G01J 1/0474; G01J 1/06; G01J 2001/0481; G01J 3/0208; G01J 3/021; G01J 3/0216; G01J 3/0227; G01J 3/0259; G01J 3/0278; G01J 3/0283; G01J 3/0291; G01J 3/457; G01J 4/00; G01N 2021/6484; G01N 21/21;
(Continued)

(56) References Cited

U.S. PATENT DOCUMENTS 4,865,445 A    9/1989 Kuriyama et al.
5,747,813 A *  5/1998 Norton ............... G01B 11/0625
                                              250/339.11
(Continued)

FOREIGN PATENT DOCUMENTS

JP    2001-099630    4/2001

*Primary Examiner* — Michael P Stafira
(74) *Attorney, Agent, or Firm* — F. Chau & Associates, LLC

(57) ABSTRACT

Disclosed are an apparatus for and a method of performing an inspection and metrology process. The apparatus may include a stage configured to load a substrate thereon, a sensor on the stage, an object lens between the sensor and the stage, a light source generating an illumination light to be transmitted to the substrate through the object lens, a first band filtering part between the light source and the object lens to control a wavelength of the illumination light within a first bandwidth, and a second band filtering part between the light source and the object lens to control a wavelength of the illumination light within a second bandwidth, which is smaller than the first bandwidth.

16 Claims, 15 Drawing Sheets

(58) Field of Classification Search
CPC .... G01N 21/255; G01N 21/474; G01N 21/57; G01N 21/6486; G01N 21/211; G01N 21/88; G01N 21/4795; G01N 2021/3137; G01N 2021/3148; G01N 21/17; G01N 21/27; G01N 21/274; G01N 21/314; G01N 21/9501; G01N 21/958; G01N 33/54386; G01N 33/558; G01N 33/56972; G01B 11/303; G01B 11/06; G01B 9/02083; G01B 9/0209

See application file for complete search history.

(56) References Cited

U.S. PATENT DOCUMENTS

| | | | |
|---|---|---|---|
| 6,694,284 | B1 | 2/2004 | Nikoonahad et al. |
| 6,950,196 | B2 | 9/2005 | Fielden et al. |
| 7,006,235 | B2 | 2/2006 | Levy et al. |
| 9,851,246 | B2 | 12/2017 | Van Der Post |
| 2002/0180986 | A1 | 12/2002 | Nikoonahad et al. |
| 2004/0073398 | A1 | 4/2004 | Nikoonahad et al. |
| 2004/0075836 | A1* | 4/2004 | Horie .................. G01B 11/168 356/369 |
| 2008/0279442 | A1* | 11/2008 | Den Boef ................. G03F 1/84 382/144 |
| 2016/0161245 | A1* | 6/2016 | Fu .......................... G01B 11/24 250/208.2 |

* cited by examiner

APPARATUS FOR AND METHOD OF PERFORMING INSPECTION AND METROLOGY PROCESS

CROSS-REFERENCE TO RELATED APPLICATIONS

This U.S. non-provisional patent application claims priority under 35 U.S.C. § 119 to Korean Patent Application No. 10-2018-0066385, filed on Jun. 8, 2018, in the Korean Intellectual Property Office, the entire contents of which are hereby incorporated by reference.

BACKGROUND OF THE INVENTION

The present disclosure relates to an apparatus for and a method of performing an inspection and metrology process, and in particular, to an inspection/metrology apparatus, which is used in a process of fabricating a semiconductor device, and a method of inspecting and measuring the semiconductor device using the apparatus.

Semiconductor devices may be a key component of various information and communication instruments. With the rapid advance of information and communication technology, there is an increasing demand for a high-performance and high-density semiconductor devices.

In many cases, the production of semiconductor devices is facilitated by a precisely controlled fabrication process. Such a precisely controlled fabrication process may be used to produce semiconductor devices that include a large number of fine patterns. During this process, an inspection apparatus may be used to inspect the fine patterns, and a measurement apparatus may be used to measure widths or thicknesses of the fine patterns. However, both the inspection apparatus and the measurement apparatus may occupy a significant amount of space in a fabrication line, which may increase the cost, and decrease the efficiency of the fabrication process.

SUMMARY

Some embodiments of the inventive concept provide an inspection/metrology apparatus, which is configured to perform both of a defect inspection process and a surface metrology process on a substrate, and an inspection/metrology method using the same.

According to some embodiments of the inventive concept, an inspection/metrology apparatus may include a stage configured to load a substrate thereon, a sensor disposed on the stage, an object lens disposed between the sensor and the stage, at least one light source generating an illumination light to be transmitted to the substrate through the object lens, a first band filtering part provided between the at least one light source and the object lens and configured to control a wavelength of the illumination light within a first bandwidth so that the sensor obtains a wide band image of the substrate, and a second band filtering part provided between the at least one light source and the object lens and configured to control a wavelength of the illumination light within a second bandwidth, which is smaller than the first bandwidth so that the sensor obtains a narrow band image of the substrate.

According to some embodiments of the inventive concept, an inspection/metrology apparatus may include a stage configured to load a substrate thereon, an object lens disposed on the stage, an image sensor disposed on the object lens, an eye lens disposed between the image sensor and the object lens to allow an image of the substrate to be imaged on the image sensor, a first illumination light source, which is configured to provide a first illumination light, which has a first bandwidth, onto the substrate so that the sensor obtains a wide band image of the substrate, and a second illumination light source, which is configured to provide a second illumination light, which has a second bandwidth smaller than the first bandwidth, onto the substrate so that the sensor obtains a narrow band image of the substrate.

According to some embodiments of the inventive concept, an inspection/metrology method may include examining a position of a substrate, determining whether it is necessary to perform a defect inspection process on the substrate, providing an illumination light of a first bandwidth to the substrate to obtain a wide band image of the substrate, when the defect inspection process is required, determining whether it is necessary to perform a surface metrology process on the substrate, and providing the illumination light of a second bandwidth, which is smaller than the first bandwidth, to the substrate to obtain a plurality of narrow band images, when the surface metrology process is required.

According to some embodiments of the inventive concept, an inspection/metrology method may include selecting a first band filtering part configured for wide band imaging; providing illumination light of a first bandwidth through the first band filtering part onto a substrate and from the substrate to an image sensor to obtain a wide band image of the substrate; selecting a second band filtering part configured for narrow band imaging; and providing illumination light of a second bandwidth, which is smaller than the first bandwidth, through the second band filtering part onto the substrate and from the substrate to the image sensor to obtain a plurality of narrow band images.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

According to embodiments described in the present disclosure, a single imaging apparatus (i.e., an inspection/metrology apparatus) may be configured to operate as both an inspection apparatus and a measurement apparatus for a semiconductor manufacturing process.

The inspection function is used to inspect the fine patterns of a semiconductor device. For example, the inspection apparatus may be used to examine whether defects (e.g., particle, short, and line-cut defects) are formed on a substrate. The inspection function may be configured to provide a wideband image, in which defect image information is contained, to an operator. The defect image information in the wide band image may be analyzed by the operator.

The measurement function (which may serve as a spectroscopic ellipsometer or a spectroscopic reflectometer) is used to measure widths or thicknesses of the fine patterns. The measurement function may be configured to analyze spectrums of an illumination light, and the analyzed spectrum may be used to obtain information on geometrical features of the fine patterns.

Figure 1:
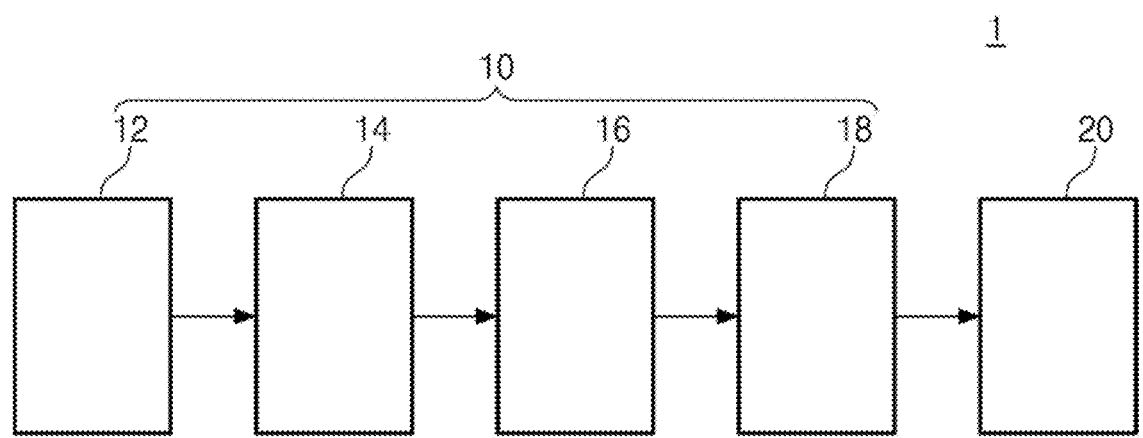
FIG. 1 is a block diagram schematically illustrating a semiconductor device fabrication system, in which an inspection/metrology apparatus according to some embodiments of the inventive concept is provided.

FIG. 1 is a block diagram schematically illustrating a semiconductor device fabrication system 1, in which an inspection/metrology apparatus 20 according to some embodiments of the inventive concept is provided.

Referring to FIG. 1, the semiconductor device fabrication system 1 may include a unit-process system 10 and an inspection/metrology apparatus 20. The unit-process system 10 may be configured to perform a plurality of unit processes on a substrate W (e.g., see FIG. 2). The unit process may include, for example, a film deposition process, a photolithography process, an etching process, and a cleaning process. In certain embodiments, the unit process may include at least one of a diffusion process, a thermal treatment process, and an ion implantation process. The inspection/metrology apparatus 20 may be used to perform an inspection process and a metrology process on the substrate W. For example, the inspection process may be performed to examine whether a defect failure (e.g., a particle defect, an electric short defect, or a line cut defect) occurs on the substrate W. The metrology process may be performed to measure surface characteristics (e.g., critical dimension (CD), film thickness, or line width) of the substrate W.

In some embodiments, the unit-process system 10 and the inspection/metrology apparatus 20 may be arranged in a fabrication line. The unit-process system 10 may be placed in front of the inspection/metrology apparatus 20 on the fabrication line. The unit-process system 10 may include, for example, a film deposition system 12, a photolithography system 14, an etching system 16, and a cleaning system 18. The film deposition system 12 may be used to form a thin film on the substrate W. The photolithography system 14 may be used to form a photoresist pattern on the substrate W or the thin film. The etching system 16 may be used to etch the substrate W the thin film using the photoresist pattern as an etch mask. The cleaning system 18 may be used to clean the substrate W. In certain embodiments, the unit-process system 10 may include at least one of a diffusion system, a thermal treatment system, or an ion implantation system.

The inspection/metrology apparatus 20 may be placed behind the unit-process system 10. The inspection/metrology apparatus 20 may be used to inspect and measure a top surface of the substrate W, when one or all of the unit process is finished. In certain embodiments, the inspection/metrology apparatus 20 may be provided between components of the unit-process system 10. For example, the inspection/metrology apparatus 20 may also be provided between the film deposition system 12 and the photolithography system 14 and between the photolithography system 14 and the etching system 16. The inspection/metrology apparatus 20 may be used to examine whether the unit process is normally performed. In some embodiments, the inspection/metrology apparatus 20 may be configured to obtain information on results of the unit process.

Figure 2:
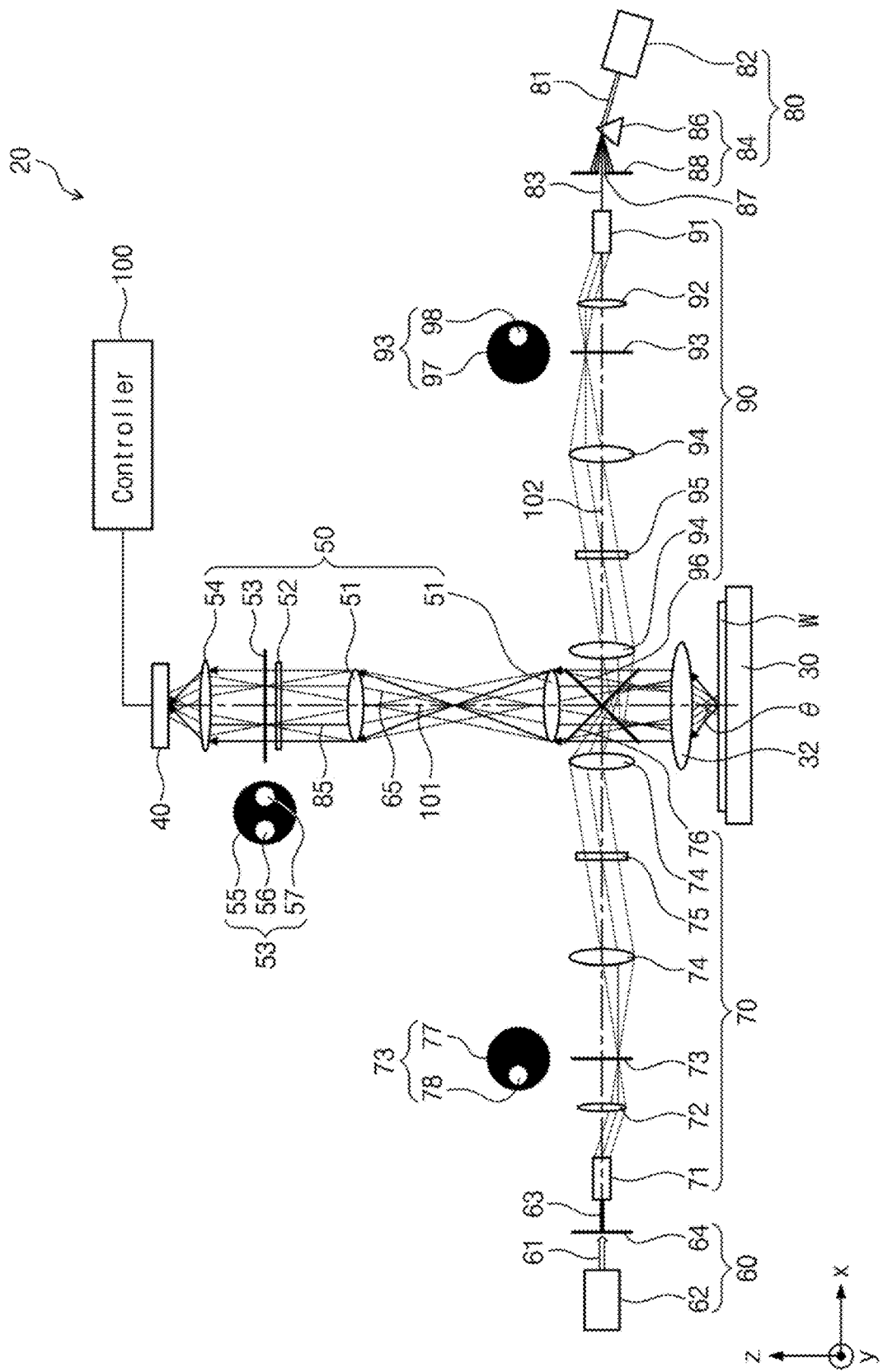
FIG. 2 is a diagram illustrating an example of the inspection/metrology apparatus of FIG. 1 according to some embodiments of the inventive concept.

FIG. 2 illustrates an example of the inspection/metrology apparatus 20 of FIG. 1.

Referring to FIG. 2, the inspection/metrology apparatus 20 may include an optical inspection device (e.g., a bright field microscope system) and an optical metrology device (e.g., a spectroscopic ellipsometer or a spectroscopic reflectometer), which are combined with each other. In some embodiments, the inspection/metrology apparatus 20 may include a stage 30, an object lens 32, an image sensor 40, an imaging optical system 50, a first illumination light source 60, a first illumination optical system 70, a second illumination light source 80, a second illumination optical system 90, and a control unit 100.

The stage 30 may be used to load the substrate W thereon. The control unit 100 may control the stage 30 to change a position of the substrate W. The stage 30 may be movable in one or more directions (e.g., an x or y direction) that is parallel to a top surface of the substrate W, during the inspection and metrology process on the substrate W.

The object lens 32 may be provided on the stage 30. The object lens 32 may be configured to provide an enlarged image of the substrate W to the image sensor 40. In some embodiments, the object lens 32 may have, for example, a numerical aperture (NA) of about 0.92. In other embodiments, other NA values may be used.

The image sensor 40 may be provided on the object lens 32. The image sensor 40 may be placed on an optical axis 101 of first and second reflected lights 65 and 85, which are reflected by the substrate W. In some embodiments, the optical axis 101 of the imaging optical system 50 may be parallel to a third direction (e.g., a z direction perpendicular to the top surface of the substrate W). The image sensor 40 may be configured to produce an image of the substrate W from the first and second reflected lights 65 and 85. The image sensor 40 may include a charge coupled device (CCD) image sensor, or a complementary metal-oxide semiconductor (CMOS) image sensor, or any other suitable sensor. Although not shown, the image sensor 40 may include a plurality of pixels that are arranged in a matrix shape.

In some cases, a resolving distance R of the image sensor 40 may be inversely proportional to the NA value of the object lens 32, and may be proportional to a wavelength $\lambda$ of the first and second reflected lights 65 and 85; i.e., $R = K\lambda/NA$, where $K=0.5$. In the case where the first and second reflected lights 65 and 85 have a wavelength $\lambda$ of about 200 nm and the object lens 32 has a numerical aperture (NA) of about 0.92, the image sensor 40 may have a resolving distance that is smaller than about 108 nm.

Furthermore, sensitivity of the image sensor 40 may be equal to an incident angle $\theta$ of first and second illumination lights 63 and 83, which are incident to the substrate W through the object lens 32 and is given by the equation $\theta = \sin^{-1}(NA/n)$, where NA is the numerical aperture of the object lens 32, n is the refractive index of the air (e.g., about 1), and $\theta$ is an incident angle). In the case where the numerical aperture (NA) of the object lens 32 is 0.92, the sensitivity of the image sensor 40 and each of the incident angle ($\theta$) of the first and second illumination lights 63 and 83 may be at or about 66.66'.

The imaging optical system 50 may be placed between the object lens 32 and the image sensor 40. Here, the term 'imaging', e.g., in the imaging optical system 50, is used for distinction from the term 'illumination' in the first and second illumination optical systems 70 and 90. Specifically, the term 'imaging' is used to indicate that an element in question is one of elements constituting the imaging optical system 50. In some embodiments, the imaging optical system 50 may include imaging relay lenses 51, an imaging polarizer 52, an imaging aperture 53, and an eye lens 54. The imaging relay lenses 51 may be configured to control a distance between the object lens 32 and the eye lens 54. The imaging polarizer 52 may be placed between the imaging relay lenses 51 and the image sensor 40. The imaging polarizer 52 may be configured to change a polarization state of each of the first and second reflected lights 65 and 85, when each of the first and second reflected lights 65 and 85 passes through the imaging polarizer 52. For example, the first and second reflected lights 65 and 85 may be linearly or elliptically polarized by the imaging polarizer 52.

The imaging aperture 53 may be placed between the imaging polarizer 52 and the image sensor 40. The first and second reflected lights 65 and 85 may pass through the imaging aperture 53. The imaging aperture 53 may be used to define a beam size of each of the first and second reflected lights 65 and 85. In some embodiments, the imaging aperture 53 may include a first diaphragm 55 and first and second imaging holes 56 and 57, which are formed in the first diaphragm 55.

The first diaphragm 55 may include a black circular film. The first diaphragm 55 may be configured to absorb at least a portion of the first and second reflected lights 65 and 85. The first and second imaging holes 56 and 57 may be spaced apart from each other in the first diaphragm 55. For example, when viewed in a first direction x, the first imaging hole 56 may be placed in a left region of the first diaphragm 55, and the second imaging hole 57 may be placed in a right region of the first diaphragm 55.

However, the inventive concept is not limited to this example, and the positions of the first and second imaging holes 56 and 57 may be changed. The first imaging hole 56 may be formed to allow the first reflected light 65 to pass therethrough, and the second imaging hole 57 may be formed to allow the second reflected light 85 to pass therethrough. The first and second imaging holes 56 and 57 may be used to determine beam sizes of the first and second reflected lights 65 and 85.

The eye lens 54 may be placed between the imaging aperture 53 and the image sensor 40. The eye lens 54 may be configured to provide the first and second reflected lights 65 and 85 to the image sensor 40 to obtain an image of the substrate W using the image sensor 40. The eye lens 54 may include a tube lens. Magnification of the image of the substrate W may be calculated by multiplying a magnifying power of the object lens 32 by a magnifying power of the eye lens 54.

The first illumination light source 60 may be placed near the object lens 32. When the second illumination light 83 is not provided to the substrate W, the first illumination light source 60 may be configured to provide the first illumination light 63 to the substrate W. The first illumination light 63 may be reflected from the substrate W to form the first reflected light 65. The first illumination light 63 may have the same wavelength as that of the first reflected light 65. In some embodiments, the first illumination light source 60 may include a first light source 62 and a first band filtering part 64.

The first light source 62 may be configured to generate a first source light 61. For example, the first light source 62 may include a xenon plasma lamp or an ultraviolet light laser generator.

The first band filtering part 64 may be placed on an optical axis 102 of the first illumination light 63 that is provided from the first light source 62 to the object lens 32. The optical axis 102 of the first illumination light 63 may be parallel to the first direction x. The first band filtering part 64 may include, for example, an optical filter. The first band filtering part 64 may be configured to allow a portion of the first source light 61 to pass through, and the portion of the first source light 61 passing through the first band filtering part 64 may be used as the first illumination light 63.

The first illumination light 63 may have a first wavelength band. For example, the first wavelength band may range from about 260 nm to about 360 nm and may have a bandwidth of about 100 nm. Here, the wavelength band may be defined as a wavelength range from the smallest wavelength to the largest wavelength, and the bandwidth may be defined as a difference between the largest wavelength and the smallest wavelength. However, the inventive concept is not limited to this example. The first wavelength band may be selected to have a wavelength range from about 100 nm to about 2000 nm and to have a bandwidth of about 30 nm-100 nm.

The first illumination optical system 70 may be placed between the first band filtering part 64 and the object lens 32. The first illumination optical system 70 may be configured to transmit the first illumination light 63 to the object lens 32. Here, the term 'illumination', e.g., in the first illumination optical system 70, is used to indicate that an element in question is one of elements constituting the first or second illumination optical system 70 or 90. In some embodiments, the first illumination optical system 70 may include a first rod lens 71, a first collimation lens 72, a first illumination aperture 73, a first illumination relay lenses 74, a first illumination polarizer 75, and a first beam splitter 76. The first rod lens 71 may be configured to transmit the first illumination light 63 to the collimation lens 72. The first collimation lens 72 may be configured to provide the first illumination light 63 to the first illumination aperture 73.

The first illumination aperture 73 may be used to define a beam size of the first illumination light 63. For example, the first illumination aperture 73 may include a second diaphragm 77 and a first illumination hole 78, which is formed in the second diaphragm 77. The second diaphragm 77 may be configured to have technical features that are similar to those of the first diaphragm 55. The second diaphragm 77 may include a black circular film. The first illumination hole 78 may have a circular shape. However, the inventive concept is not limited to this example, and the first illumination hole 78 may have a polygonal (e.g., triangular, tetragonal, pentagonal, hexagonal, octagonal) shape, or a ring shape.

In the case where the first illumination hole 78 and the first imaging hole 56 have the same shape and the same arrangement structure, the first illumination light 63 and the first reflected light 65 may have the same beam size. This may enable increased optical transmission efficiency. If the first imaging hole 56 is placed in a specific region (e.g., a left region) of the first diaphragm 55, the first illumination hole 78 may also be placed in a corresponding region (e.g., a left region) of the second diaphragm 77. If the first imaging hole 56 is placed in an opposite region (e.g., a right region) of the first diaphragm 55, the first illumination hole 78 may also be placed in an opposite region (e.g., a right region) of the second diaphragm 77.

The first illumination relay lenses 74 may be placed between the first illumination aperture 73 and the object lens 32. The first illumination relay lenses 74 may be configured to control a distance between the first illumination light source 60 and the object lens 32. The first illumination polarizer 75 may be placed between the first illumination relay lenses 74.

The first illumination polarizer 75 may be configured to change a polarization state of the first illumination light 63. The first illumination polarizer 75 may have technical features that are similar to those of the imaging polarizer 52. A polarization state and a polarization direction of the first illumination light 63 may be the same as those of the first reflected light 65. For example, if the first illumination light 63 is linearly polarized, the first reflected light 65 may also be linearly polarized. If the first illumination light 63 is elliptically polarized, the first reflected light 65 may also be elliptically polarized.

The first beam splitter 76 may be placed between the first illumination relay lenses 74 and the object lens 32. Furthermore, the first beam splitter 76 may be placed between the object lens 32 and the imaging relay lenses 51. The first beam splitter 76 may be configured to provide the first illumination light 63 to the object lens 32. The first illumination light 63 may be incident onto the substrate W through the object lens 32. The first illumination light 63 may be reflected from the substrate W to form the first reflected light 65. The first reflected light 65 may be provided to the image sensor 40 through the object lens 32, the first beam splitter 76, and the imaging optical system 50.

Figure 3:
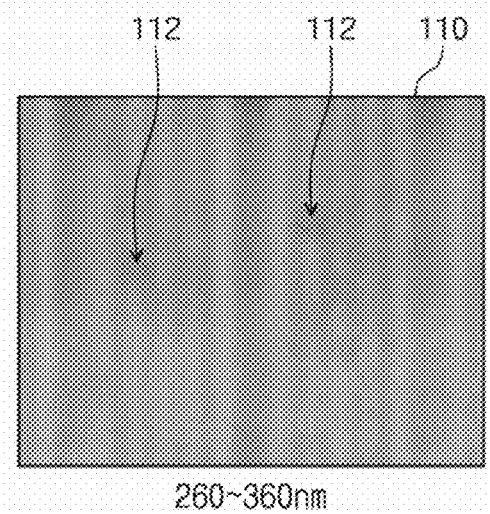
FIG. 3 is a diagram showing a wide band image obtained by using a first reflected light of FIG. 2 according to some embodiments of the inventive concept.

FIG. 3 illustrates a wide band image 110, which is obtained by using the first reflected light 65 of FIG. 2.

Referring to FIG. 3, in the control unit 100, the first reflected light 65 obtained by the image sensor 40 may be used to produce the wide band image 110 of the substrate W. The wide band image 110 may be an inspection image. In some embodiments, there may be defect images 112 in the wide band image 110. The defect images 112 may be produced when a particle defect, a short defect, or a line cut defect is formed on the substrate W. That is, in the control unit 100, the wide band image 110 and the defect images 112 may be analyzed to examine or inspect whether there are defects on the substrate W.

Referring back to FIG. 2, when the first illumination light 63 is not provided to the substrate W, the second illumination light source 80 may provide the second illumination light 83 to the substrate W. In some embodiments, the control unit 100 may use the second illumination light 83 to measure surface characteristics of the substrate W to complete the inspection process without changing the position of the substrate W. In some embodiments, the second illumination light source 80 may include a second light source 82 and a second band filtering part 84. The second light source 82 may be configured to generate a second source light 81. The second light source 82 may be the same as the first light source 62.

The second band filtering part 84 may be placed on the optical axis 102 of the second illumination light 83 that is provided from the second light source 82 to the second illumination optical system 90. The optical axis 102 of the second illumination light 83 may be parallel to the first direction x. The second band filtering part 84 may include a monochromator. The second band filtering part 84 may be configured to extract the second illumination light 83 from the second source light 81. The second band filtering part 84 may include, for example, a prism 86 and a slit structure 88. The prism 86 may be configured to obtain the spectrum of the second source light 81.

The slit structure 88 may have a slit 87. The slit 87 may be configured to selectively transmit a portion of the spectrum of the second source light 81 and to produce the second illumination light 83. The second illumination light 83 may have a plurality of second wavelength bands, which are within the first wavelength band. The second illumination light 83 of each of the second wavelength bands may have a second bandwidth smaller than the first bandwidth. For example, if the first bandwidth is about 100 nm, the second bandwidth may be about 20 nm. The second wavelength bands of the second illumination light 83 may be wavelength ranges of 240-260 nm, 260-280 nm, 280-300 nm, and 300-320 nm. That is, the second band filtering part 84 may be configured to allow the second illumination light 83 to have the second bandwidth that is narrower than the first bandwidth of the first illumination light 63.

The second illumination optical system 90 may be placed between the slit structure 88 and the object lens 32. The second illumination optical system 90 may be configured to transmit the second illumination light 83 to the object lens 32. In some embodiments, the second illumination optical system 90 may include a second rod lens 91, a second collimation lens 92, a second illumination aperture 93, a second illumination relay lenses 94, a second illumination polarizer 95, and a second beam splitter 96. The second rod lens 91 may be configured to transmit the second illumination light 83 to the second collimation lens 92. The second collimation lens 92 may be configured to provide the second illumination light 83 to the second illumination aperture 93.

The second illumination aperture 93 may be used to define a beam size of the second illumination light 83. For example, the second illumination aperture 93 may include a third diaphragm 97 and a second illumination hole 98, which is formed in the third diaphragm 97. The third diaphragm 97 may be the same as the first and second diaphragms 55 and 77. The third diaphragm 97 may include a black circular film. The second illumination hole 98 may have a circular shape. However, the inventive concept is not limited thereto, and the shape of the second illumination hole 98 may be variously changed. In the case where the second illumination hole 98 and the second imaging hole 57 have the same shape and the same arrangement structure, the second illumination light 83 and the second reflected light 85 may have the same beam size. This may enable increased optical transmission efficiency.

If, in a metrology process using a spectroscopic inclined optical system, the second imaging hole 57 is placed at an opposite side (e.g., a right side) of the first diaphragm 55, the second illumination hole 98 may also be placed in an opposite region (e.g., a right region) of the third diaphragm 97. If the second imaging hole 57 is placed in a region (e.g., a left region) of the first diaphragm 55, the second illumination hole 98 may also be placed in a region (e.g., a left region) of the third diaphragm 97.

Thus, according to the present disclosure, the inspection/metrology apparatus 20 may select a first band filtering part 64 configured for wide band imaging. Then, the inspection/metrology apparatus 20 may provide first illumination light 63 having a first bandwidth through the first band filtering part 64 onto the substrate W, and from the substrate W to the image sensor 40 to obtain a wide band image of the substrate.

Subsequently, the same inspection/metrology apparatus 20 may select a second band filtering part 84 configured for narrow band imaging. Then the inspection/metrology apparatus 20 may provide second illumination light 83, having a second bandwidth which is smaller than the first bandwidth, through the second band filtering part 84 onto the substrate W, and from the substrate W to the image sensor 40 to obtain one or more narrow band images.

As illustrated in FIG. 2, in some embodiments the first illumination light 63 and the second illumination light 83 may pass through separate illumination optical systems (e.g., first illumination optical system 70 and second illumination optical system 90, respectively). However, as described below in more detail with reference to FIGS. 13-16, in some embodiments, two band filtering parts may be used together with a same illumination optical system.

Figure 4:
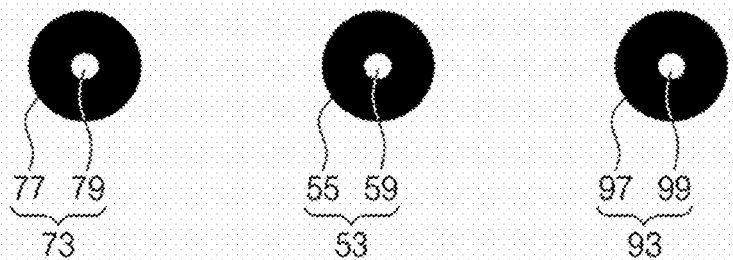
FIGS. 4 and 5 are diagrams illustrating examples of imaging, first, and second illumination apertures of FIG. 2 according to some embodiments of the inventive concept.

FIG. 4 illustrates an example of the imaging, first, second illumination apertures 53, 73, and 93 of FIG. 2.

Referring to FIG. 4, in a metrology process using a spectroscopic perpendicular optical system, the imaging, first, and second illumination apertures 53, 73, and 93 may have the same shape and the same arrangement structure. In some embodiments, the imaging, first, and second illumination apertures 53, 73, and 93 may include first to third center holes 59, 79, and 99, respectively, which are provided at respective centers of the first to third diaphragms 55, 77, and 97. All of the first to third center holes 59, 79, and 99 may have the same shape and the same size.

Figure 5:
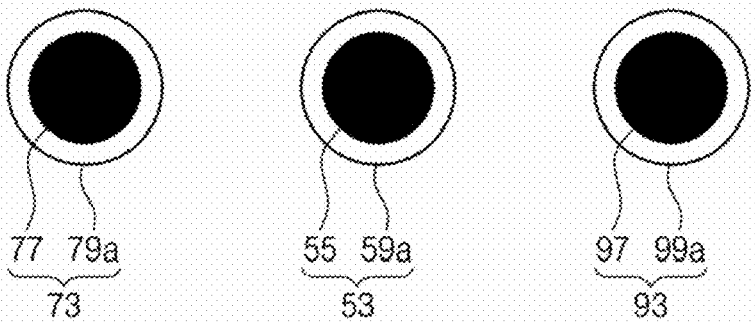

FIG. 5 illustrates an example of the imaging, first, second illumination apertures 53, 73, and 93 of FIG. 2.

Referring to FIG. 5, in a metrology process using a spectroscopic perpendicular optical system, the imaging, first, and second illumination apertures 53, 73, and 93 may include first to third edge holes 59a, 79a, and 99a, respectively, which are provided at edges of the first to third diaphragms 55, 77, and 97. The first to third edge holes 59a, 79a, and 99a may have the same shape and the same size. For example, all of the first to third edge holes 59a, 79a, and 99a may be shaped like a ring.

Referring back to FIG. 2, the second illumination relay lenses 94 may be provided between the second illumination aperture 93 and the object lens 32. The second illumination relay lenses 94 may be configured to adjust a distance between the second illumination light source 80 and the object lens 32. The second illumination polarizer 95 may be provided between the second illumination relay lenses 94.

The second illumination polarizer 95 may be configured to change a polarization state of the second illumination light 83. The second illumination polarizer 95 may be configured to have technical features that are similar to those of the imaging polarizer 52. A polarization state and a polarization direction of the second illumination light 83 may be the same as those of the second reflected light 85.

The second beam splitter 96 may be placed between the second illumination relay lenses 94 and the object lens 32. Furthermore, the second beam splitter 96 may be placed between the object lens 32 and the imaging relay lenses 51. The second beam splitter 96 may be provided to cross the first beam splitter 76. The object lens 32 may be configured to provide the second illumination light 83 to the substrate W. In some embodiments, incident directions of the first and second illumination lights 63 and 83 may be opposite to each other. The second illumination light 83 may be reflected from the substrate W to form the second reflected light 85. The second reflected light 85 may be provided to the image sensor 40 through the object lens 32 and the imaging optical system 50.

Figure 6:
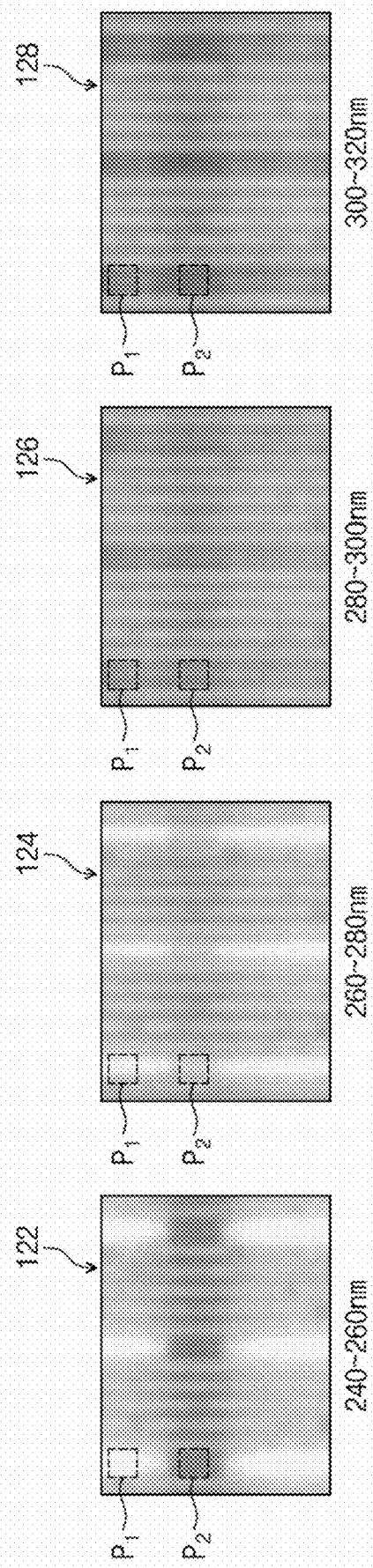
FIG. 6 is a diagram illustrating first to fourth narrow band images, which are obtained by using a second reflected light of FIG. 2 according to some embodiments of the inventive concept.

FIG. 6 illustrates first to fourth narrow band images 122-128, which are obtained by using.

Referring to FIG. 6, the second reflected light 85 obtained by the image sensor 40 may be used as first to fourth narrow band images 122-128 in the control unit 100. The first narrow band image 122 may be obtained from the second reflected light 85 whose wavelength band ranges from about 240 nm to about 260 nm. The second to fourth narrow band images 124, 126, and 128 may be obtained from the second reflected lights 85 having wavelength bands of about 260-280 nm, about 280-300 nm and about 300-320 nm. In the first to fourth narrow band images 122-128, an intensity and/or a brightness may vary from position to position.

Figure 7:
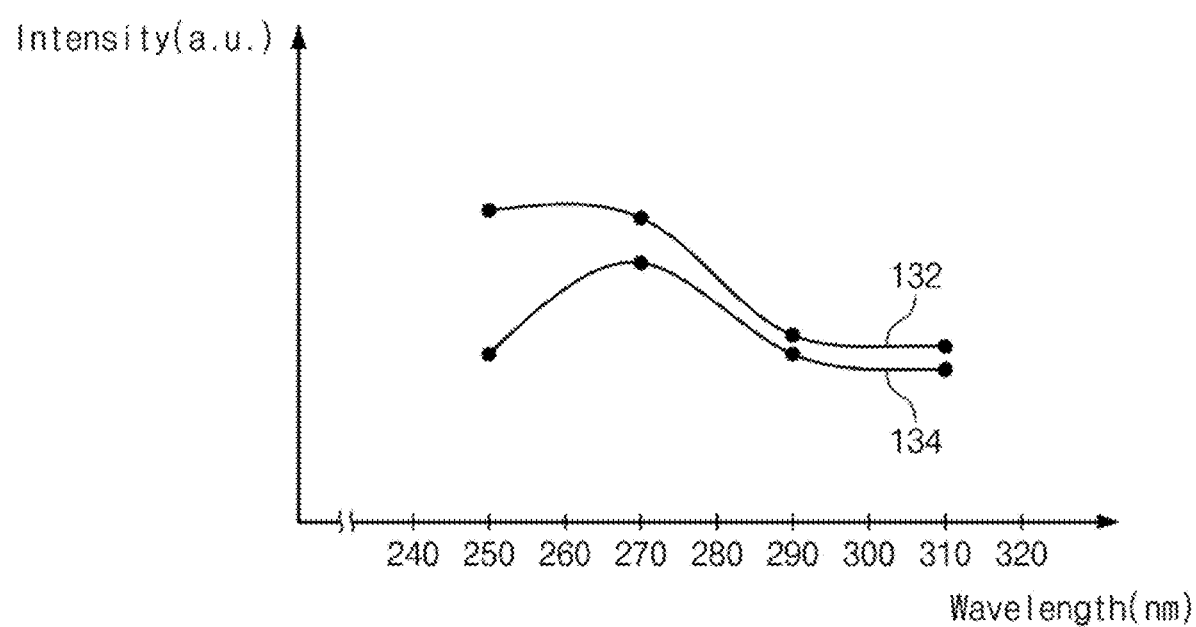
FIG. 7 is a graph illustrating first and second spectrums, which are obtained from first to fourth narrow band images of FIG. 6 according to some embodiments of the inventive concept.

FIG. 7 illustrates first and second spectrums 132 and 134, which are obtained from the first to fourth narrow band images 122-128 of FIG. 6.

Referring to FIG. 7, the control unit 100 may analyze the first to fourth narrow band images 122-128 to obtain first and second spectrums 132 and 134. The first spectrum 132 may correspond to an intensity of the second reflected light 85 obtained at a first pixel P1 of each of the first to fourth narrow band images 122-128. Similarly, the second spectrum 134 may correspond to an intensity of the second reflected light 85 obtained at a second pixel P2 of each of the first to fourth narrow band images 122-128.

The control unit 100 may analyze the first and second spectrums 132 and 134 to calculate or measure information on surface characteristics (e.g., a film thickness and a pattern width) of the substrate W. In the following description of the inspection/metrology method, a method of calculating the surface characteristics will be described in more detail. Under control of the control unit 100, a defect inspection process may be performed on a specific point of the substrate W, and then, a surface metrology process may be performed to measure surface characteristics of the substrate W, without a change in position of the inspected substrate W.

The inspection/metrology apparatus 20 may be used to perform the following inspection/metrology method.

Figure 8:
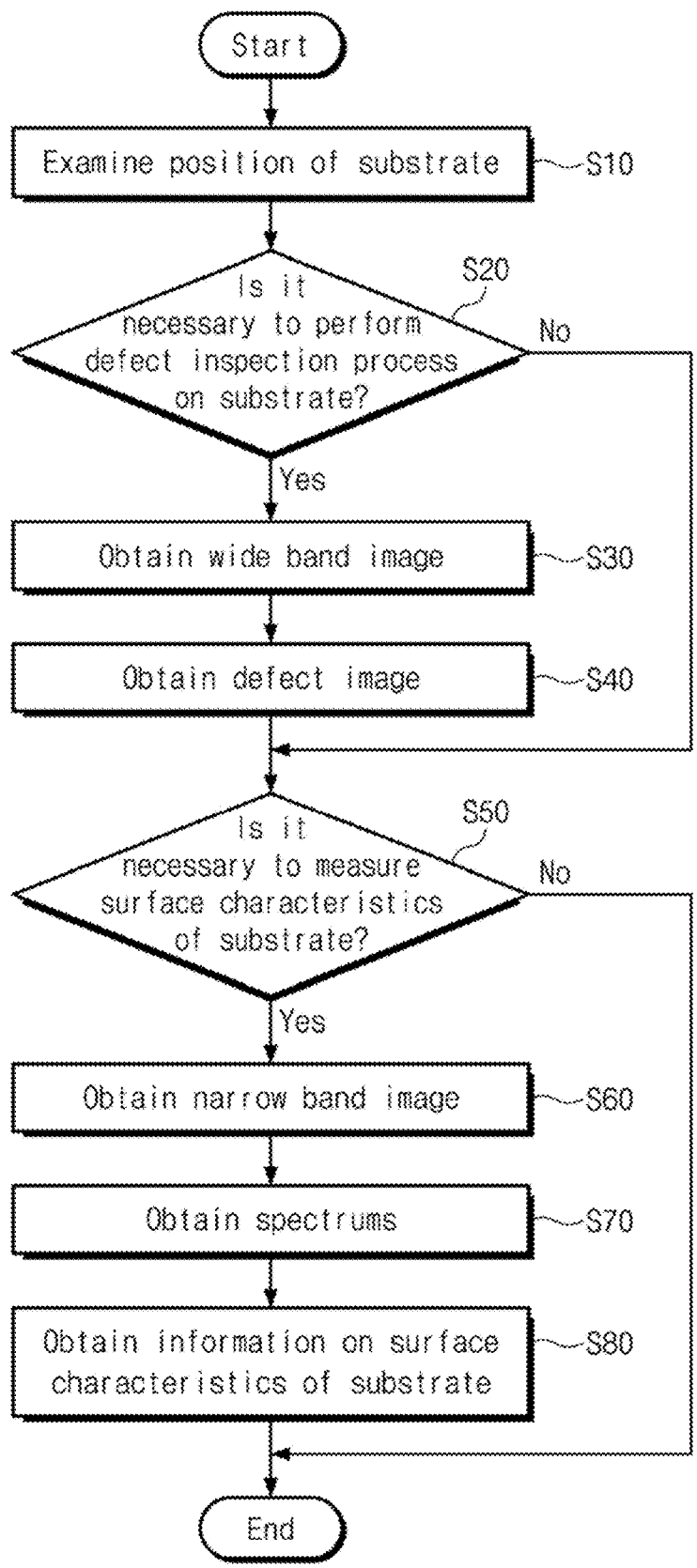
FIG. 8 is a flow chart illustrating an example of an inspection/metrology method using an inspection/metrology apparatus of FIG. 2 according to some embodiments of the inventive concept.

FIG. 8 is a flow chart illustrating an example of an inspection/metrology method using the inspection/metrology apparatus 20 of FIG. 2.

Referring to FIG. 8, the inspection/metrology method may include examining a position of a substrate W (in S10), determining whether it is necessary to perform a defect inspection process on the substrate W (in S20), obtaining a wide band image 110 (in S30), obtaining defect images 112 (in S40), determining whether it is necessary to measure surface characteristics of the substrate W (in S50), obtaining narrow band images (in S60), obtaining spectrums (in S70), and obtaining information on surface characteristics of the substrate W (in S80).

First, if the substrate W is loaded on the stage 30, the control unit 100 may examine a position of the substrate W (in S10).

Next, the control unit 100 may determine whether it is necessary to perform the defect inspection process on the substrate W (in S20).

If the defect inspection process on the substrate W is required, the control unit 100 may obtain the wide band image 110 using the first illumination light source 60 and the image sensor 40 (in S30). If the first illumination light 63 generated by the first illumination light source 60 is provided onto the substrate W, the first illumination light 63 may be reflected by the substrate W to form the first reflected light 65, and the first reflected light 65 may be received by the image sensor 40 and may be used as the wide band image 110 in the control unit 100. The first reflected light 65 may have a first wavelength band and a first bandwidth. The wide band image 110 may have the defect images 112. If the defect inspection process on the substrate W is not required, the control unit 100 may determine whether it is necessary to measure surface characteristics of the substrate W (in S50).

Figure 9:
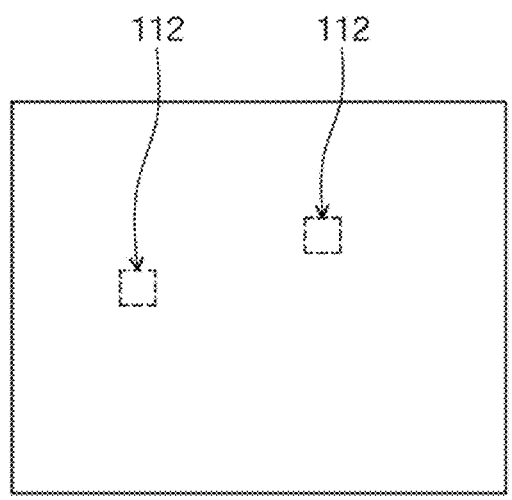
FIG. 9 is a diagram illustrating defect images of FIG. 3 according to some embodiments of the inventive concept.

FIG. 9 illustrates the defect images 112 of FIG. 3.

Referring to FIGS. 8 and 9, the control unit 100 may obtain the defect images 112 from the wide band image 110 (in S40). For example, in the control unit 100, the wide band image 110 may be compared with a reference image (not shown) to obtain the defect images 112, from which a background image of the wide band image 110 is removed. The reference image may be a previously-stored reference inspection image. In certain embodiments, the reference image may be a reference inspection image, which is obtained at another region of the substrate W. If the inspection process for a selected region of the substrate W is finished, the first illumination light 63 may not be provided to the substrate W.

Thereafter, the control unit 100 may determine whether it is necessary to measure surface characteristics of the substrate W (in S50).

If the metrology and/or measurement of surface characteristics of the substrate W is required, the control unit 100 may obtain the narrow band images using the second illumination light source 80 and the image sensor 40 (in S60). If the second illumination light 83 generated by the second illumination light source 80 is provided onto the substrate W, the second illumination light 83 may be reflected by the substrate W to form the second reflected light 85, and the second reflected light 85 may be received by the image sensor 40 and may be used as the narrow band images in the control unit 100. The narrow band images may include the first to fourth narrow band images 122-128. The first to fourth narrow band images 122-128 may be images that are respectively obtained at the second wavelength bands of the second reflected light 85. If the metrology of surface characteristics of the substrate W is not required, the control unit 100 may terminate the inspection/metrology process on the selected region of the substrate W.

Next, the control unit 100 may analyze brightness intensities of pixels in each of the narrow band images to obtain the spectrums (in S70). The spectrums may be obtained from each point of the substrate W. In the case where the spectrums are the first and second spectrums 132 and 134 of FIG. 7, the first and second spectrums 132 and 134 may be measured from points of the substrate W corresponding to the first and second pixels P1 and P2.

Thereafter, the control unit 100 may analyze the spectrums to obtain information on surface characteristics of the substrate W (in S80). For example, the control unit 100 may compare the spectrums with reference spectrums to obtain information on the surface characteristics of the substrate W. Here, the reference spectrums may be prepared to contain information on surface characteristics of the substrate W. In the control unit 100, information on the reference spectrums associated with (e.g., similar to) the spectrums may be extracted to obtain information on surface characteristics of the substrate W for each pixel. If the inspection process for a selected region of the substrate W is finished, the second illumination light 83 may not be provided to the substrate W.

Although not shown, the stage 30 may be used to move the substrate W from a first position (i.e., the initial position) to a second position that is different from the first position. Under control of the control unit 100, the inspection process and the surface metrology process described with reference to steps S10 to S80 of FIG. 8 may be performed on the second position of the substrate W.

Figure 10:
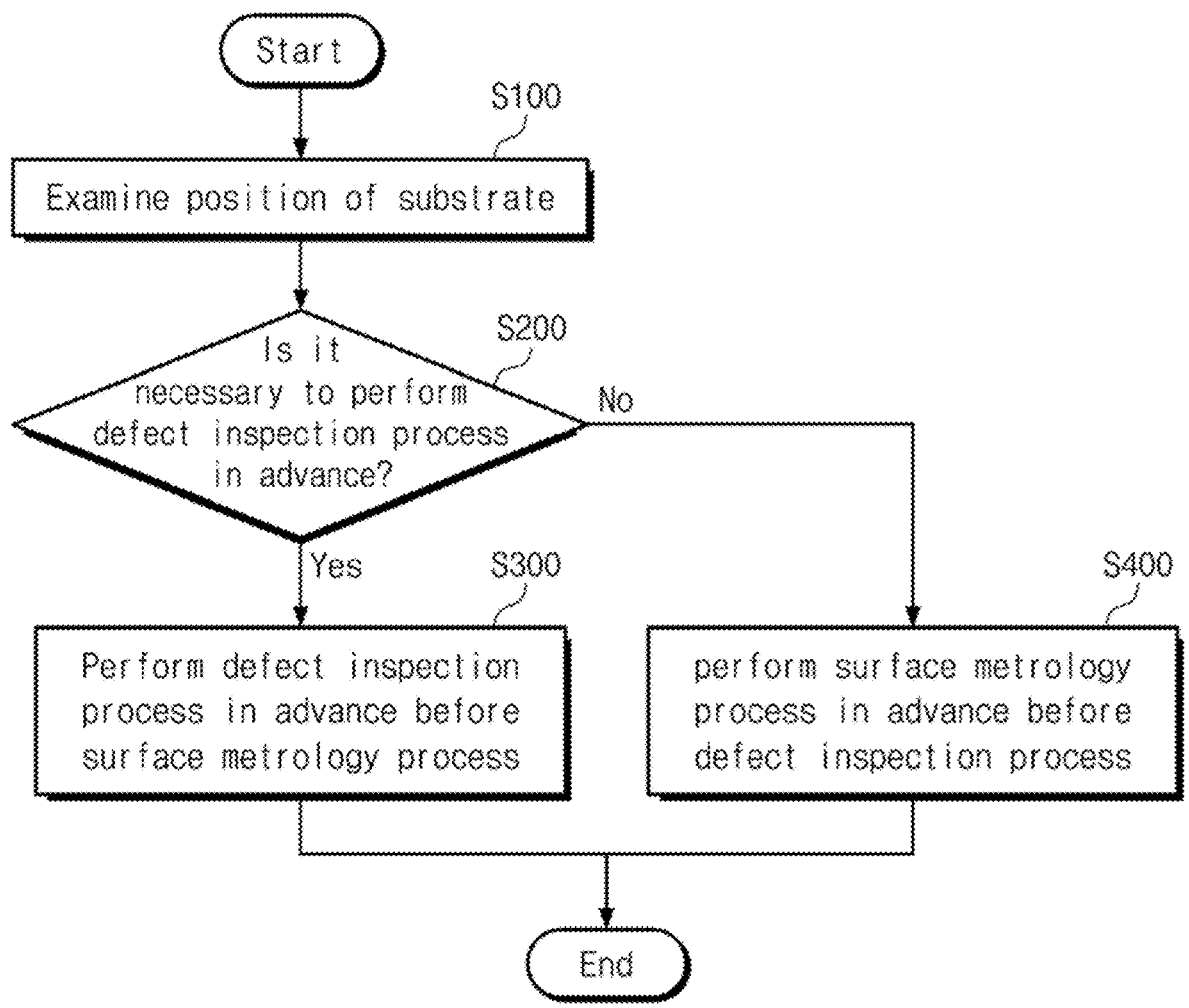
FIG. 10 is a flow chart illustrating an example of an inspection/metrology method using an inspection/metrology apparatus of FIG. 2 according to some embodiments of the inventive concept.

FIG. 10 is a flow chart illustrating an example of an inspection/metrology method using the inspection/metrology apparatus 20 of FIG. 2.

Referring to FIG. 10, the inspection/metrology method may include preparing the substrate W (in S100), determining whether it is necessary to perform the defect inspection process in advance (in S200), and performing the defect inspection process in advance before the surface metrology process (in S300) or performing the surface metrology process in advance before the defect inspection process (in S400).

First, the substrate W may be prepared in a substrate fabrication system or a substrate fabrication apparatus (in S100). A robot arm may be used to load the substrate W on the stage 30.

Next, the control unit 100 may determine whether it is necessary to perform the defect inspection process on the substrate W in advance (in S200).

If the defect inspection process is required to be performed in advance, under control of the control unit 100, the defect inspection process may be performed in advance before the surface metrology process (in S300). Otherwise, the surface metrology process may be performed in advance before the defect inspection process (in S400).

Figure 11:
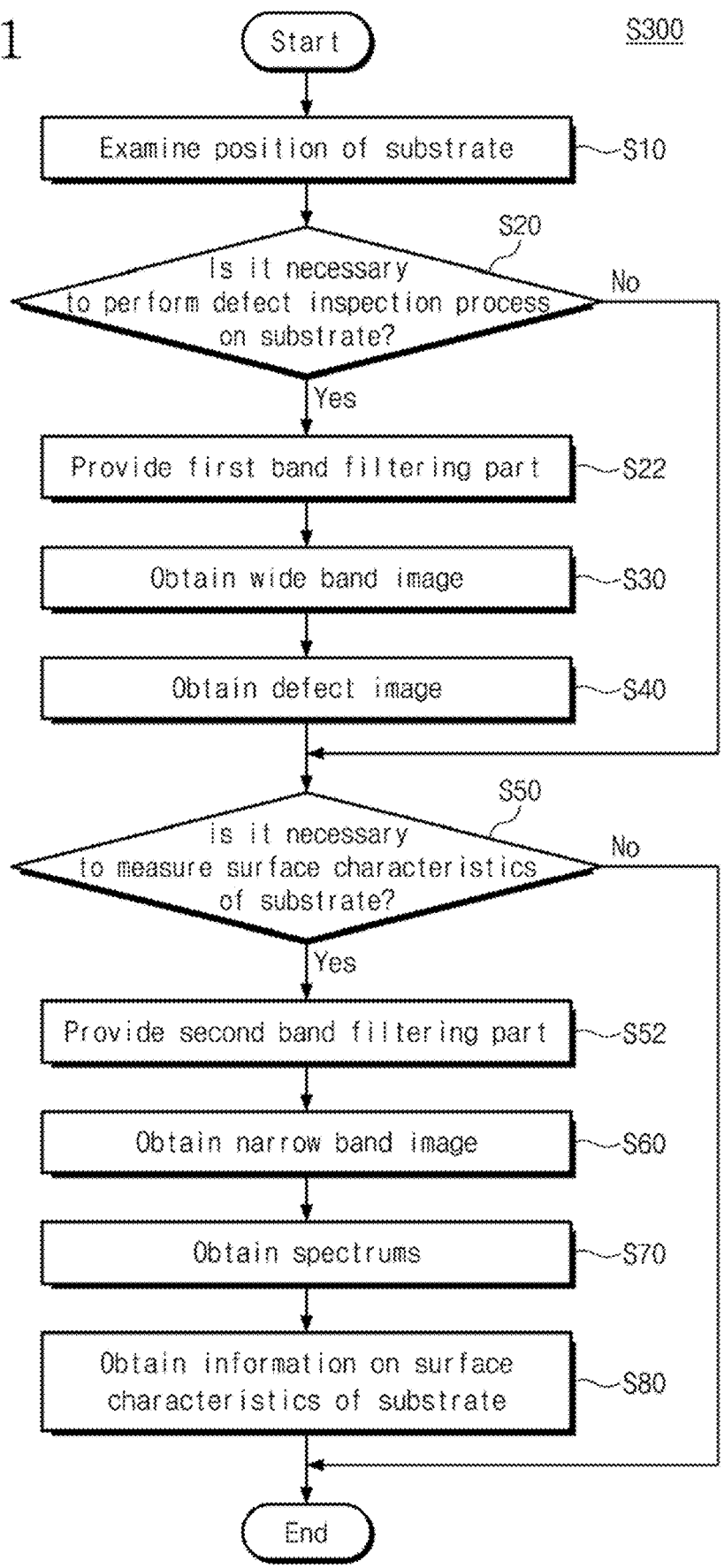
FIG. 11 is a flow chart exemplarily illustrating a method of performing a defect inspection process before a surface metrology process, as shown in FIG. 10 according to some embodiments of the inventive concept.

FIG. 11 is a flow chart exemplarily illustrating a method of performing a defect inspection process before a surface metrology process (as shown in S300 of FIG. 10).

Referring to FIG. 11, the step S300 of performing the defect inspection process in advance before the surface metrology process may be performed in the same manner as that of FIG. 8. In some embodiments, the step S300 of performing the defect inspection process in advance before the surface metrology process may include examining a position of the substrate W (in S10), determining whether it is necessary to perform the defect inspection process on the substrate W (in S20), obtaining the wide band image 110 (in S30), obtaining the defect images 112 (in S40), determining whether it is necessary to measure surface characteristics of the substrate W (in S50), obtaining the narrow band images (in S60), obtaining the spectrums (in S70), and obtaining information on surface characteristics of the substrate W (in S80).

As in FIG. 10, if the defect inspection process is not performed in advance, under control of the control unit 100, the surface metrology process may be performed in advance before the defect inspection process.

Figure 12:
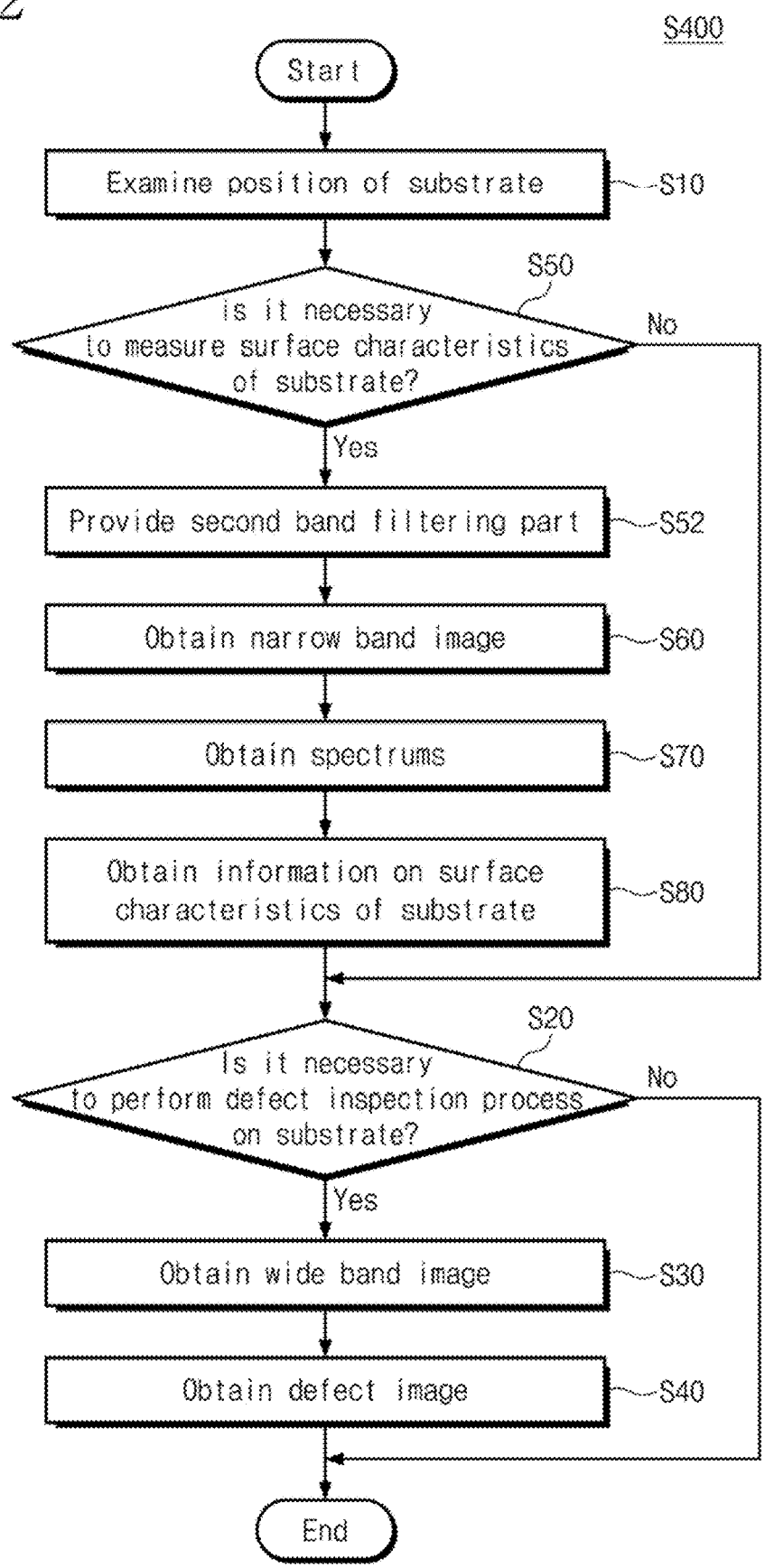
FIG. 12 is a flow chart exemplarily illustrating a method of performing a surface metrology process before a defect inspection process, as shown in FIG. 10 according to some embodiments of the inventive concept.

FIG. 12 is a flow chart exemplarily illustrating a method of performing the surface metrology process before the defect inspection process (as shown in S400 of FIG. 10).

Referring to FIG. 12, the step S400 of performing the surface metrology process in advance before the defect inspection process may include determining whether it is necessary to measure surface characteristics of the substrate W (in S50), obtaining the narrow band images (in S60), obtaining the spectrums (in S70), obtaining the information on surface characteristics of the substrate W (in S80), determining the position of the substrate W (in S10), determining whether it is necessary to perform the defect inspection process on the substrate W (in S20), obtaining the wide band image 110 (in S30), and obtaining the defect images 112 (in S40).

Figure 13:
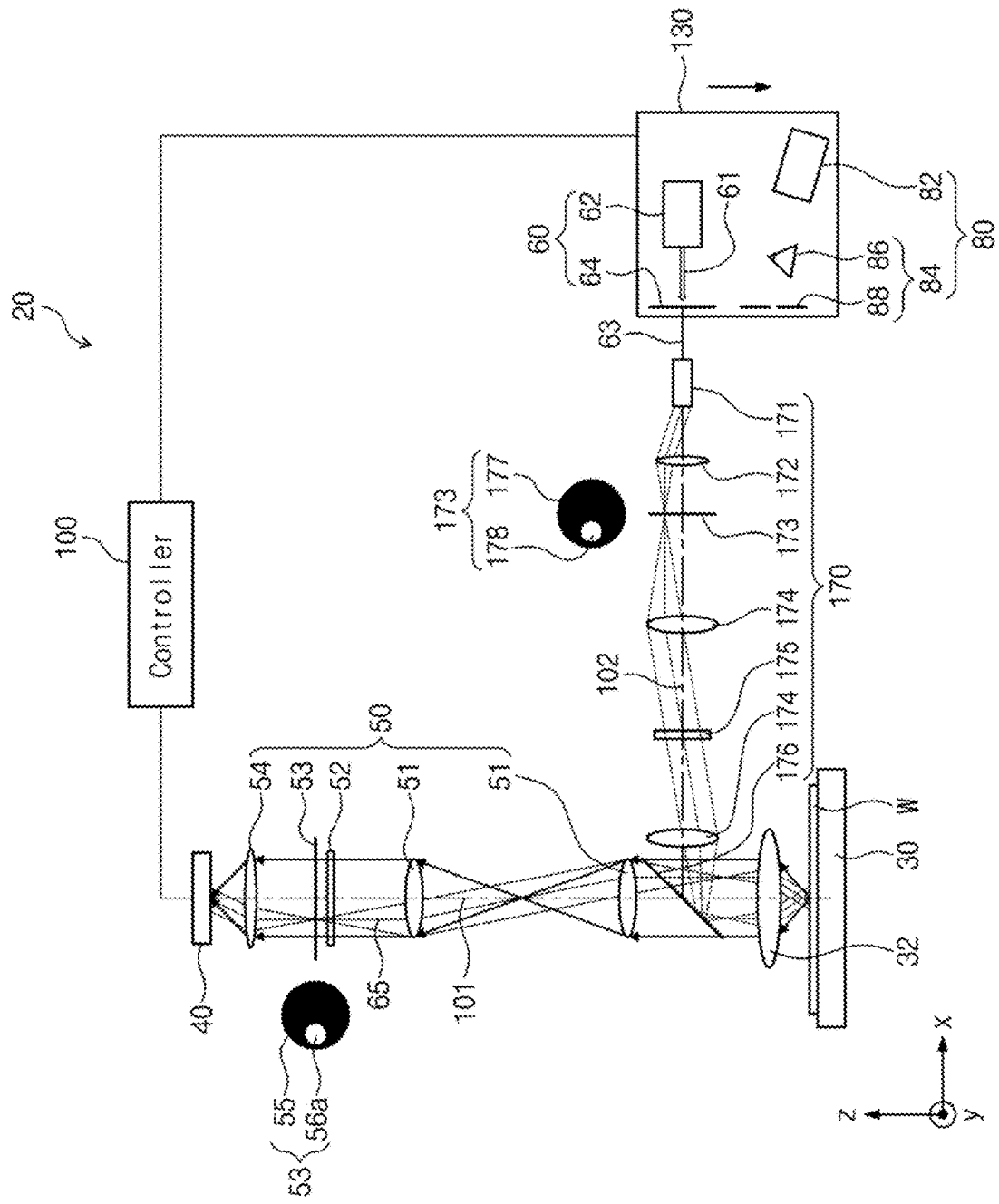
FIGS. 13 and 14 are diagrams illustrating an example of the inspection/metrology apparatus of FIG. 1 according to some embodiments of the inventive concept.
Figure 14:
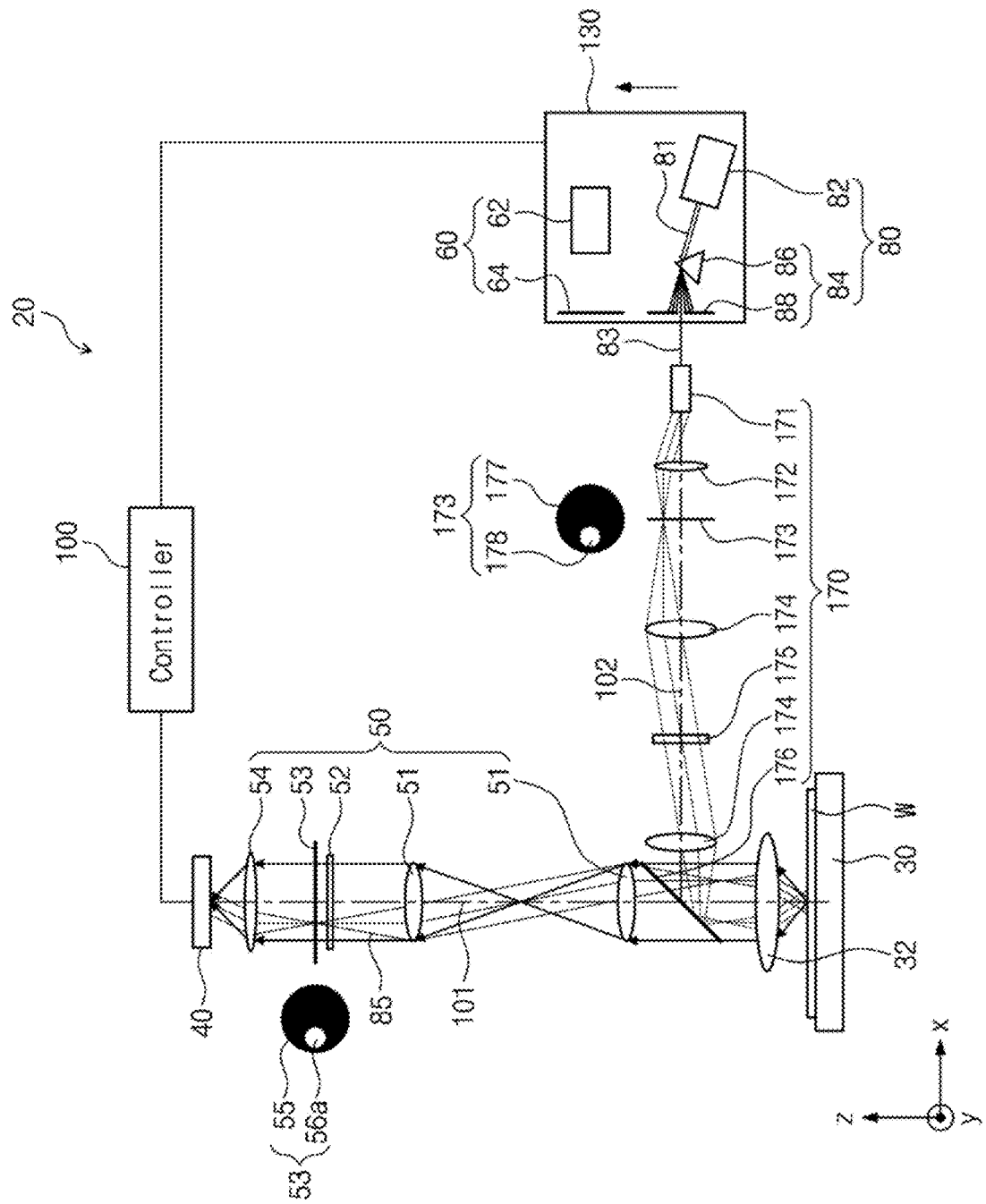

FIGS. 13 and 14 illustrate an example of the inspection/metrology apparatus 20 of FIG. 1.

Referring to FIGS. 13 and 14, the inspection/metrology apparatus 20 may include a band selection part 130, which is configured to selectively provide one of the first and second illumination light sources 60 and 80 along the optical axis 102 of one of the first and second illumination lights 63 and 83. The band selection part 130 may be connected to the control unit 100. The band selection part 130 may be used to align one of the first and second illumination light sources 60 and 80 to the optical axis 102 of one of the first and second illumination lights 63 and 83. In some embodiments, the band selection part 130 may be connected to the first and second illumination light sources 60 and 80. If the optical axis 102 is parallel to the first direction x, the band selection part 130 may be configured to move the first and second illumination light sources 60 and 80 in the second or third direction (e.g., in direction y or z). The band selection part 130 may include, for example, a plate driver.

The stage 30, the image sensor 40, the imaging optical system 50, and the control unit 100 may be configured to have substantially the same features as those in FIG. 2. The illumination optical system 170 may be configured to have substantially the same features as one of the first and second illumination optical systems 70 and 90 of FIG. 2. A rod lens 171, a collimation lens 172, an illumination aperture 173, an illumination relay lenses 174, an illumination polarizer 175, and a beam splitter 176 of the illumination optical system 170 may correspond to the first rod lens 71, the first collimation lens 72, the first illumination aperture 73, the first illumination relay lenses 74, the first illumination polarizer 75, and the first beam splitter 76, respectively, of the first illumination optical system 70 of FIG. 2.

An imaging hole 56a of the imaging aperture 53 may have the same shape and direction as the first illumination hole 78 of the first illumination aperture 73. Similarly, the rod lens 171, the collimation lens 172, the illumination aperture 173, the illumination relay lenses 174, the illumination polarizer 175, and the beam splitter 176 of the illumination optical system 170 may correspond to the second rod lens 91, the second collimation lens 92, the second illumination aperture 93, the second illumination relay lenses 94, the second illumination polarizer 95, and the second beam splitter 96 of the second illumination optical system 90 of FIG. 2, respectively. The imaging hole 56a may have the same shape and the same direction as those of the second illumination hole 98 of the second illumination aperture 93.

Referring to FIG. 13, the band selection part 130 may be configured to place the first illumination light source 60 on the optical axis 102 of the first illumination light 63, when the defect inspection process is performed on the substrate W. The first illumination light source 60 may be configured to provide the first illumination light 63 to the substrate W, and as a result, the wide band image 110 may be obtained by the image sensor 40 and the control unit 100. In the control unit 100, the wide band image 110 may be analyzed to examine or inspect whether there is a defect on the substrate W.

Referring to FIG. 14, the band selection part 130 may be configured to place the second illumination light source 80 on the optical axis 102 of the second illumination light 83, when the surface metrology process is performed on the substrate W. The second illumination light source 80 may also be configured to provide the second illumination light 83 to the substrate W, and in this case, the narrow band images produced from the image sensor 40 and the control unit 100 may be obtained by the image sensor 40 and the control unit 100. In the control unit 100, the narrow band images may be analyzed to obtain information on surface characteristics of the substrate W.

Figure 15:
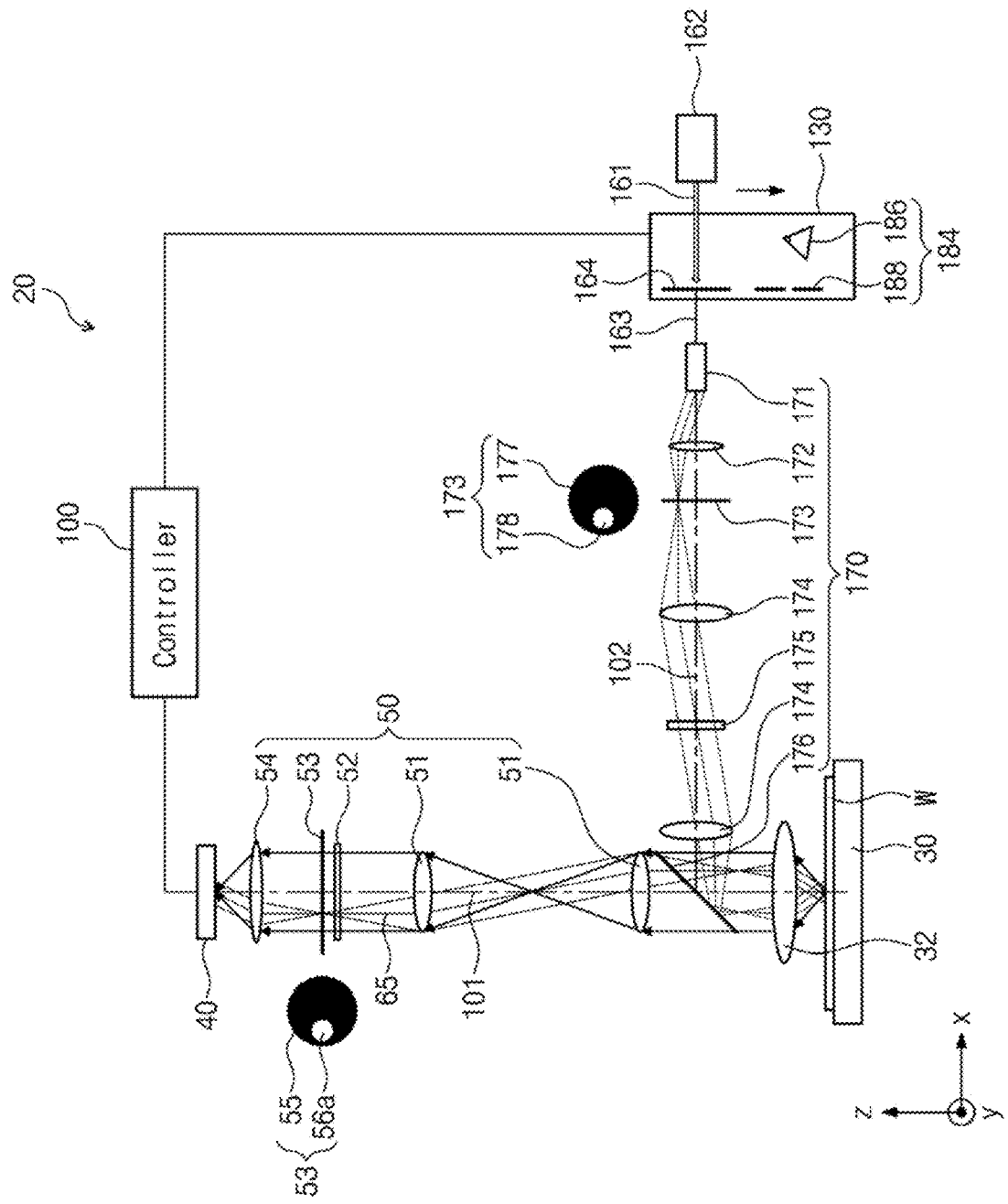
FIGS. 15 and 16 are diagrams illustrating an example of the inspection/metrology apparatus of FIG. 1 according to some embodiments of the inventive concept.
Figure 16:
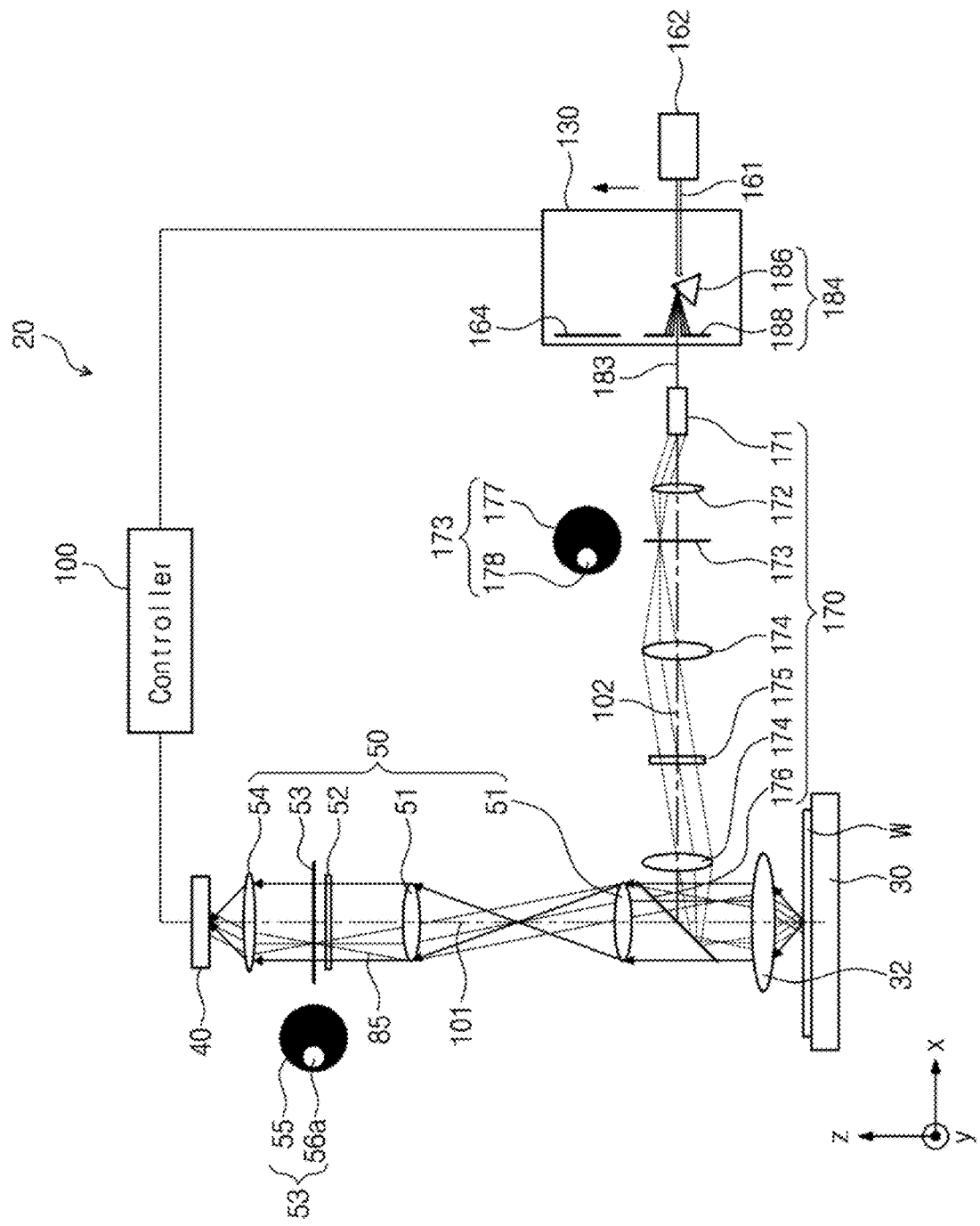

FIGS. 15 and 16 illustrate an example of the inspection/metrology apparatus 20 of FIG. 1.

Referring to FIGS. 15 and 16, the band selection part 130 of the inspection/metrology apparatus 20 may be configured to selectively place one of first and second band filtering parts 164 and 184 on the optical axis 102 of one of first and second illumination lights 163 and 183, depending on whether the current process is the defect inspection process or the surface metrology process. In some embodiments, the band selection part 130 may be connected to the first and second band filtering parts 164 and 184. In the case where the optical axis 102 is parallel to the first direction x, the band selection part 130 may be configured to move the first and second band filtering parts 164 and 184 in the second or third direction (e.g., in direction y or z).

The stage 30, the image sensor 40, the imaging optical system 50, illumination optical system 170, and the control unit 100 may be configured to have substantially the same features as those in FIGS. 13 and 14.

Referring to FIG. 15, the band selection part 130 may be configured to place the first band filtering part 164 on the optical axis 102 between the illumination optical system 170 and a light source 162, when the defect inspection process is performed on the substrate W. The light source 162 may be configured to generate an illumination light 161. The first band filtering part 164 may be configured to allow a portion of the illumination light 161 to pass therethrough, and in this case, the portion of the illumination light 161 passing through the first band filtering part 164 may be used as the first illumination light 163. The first band filtering part 164 may also be configured to provide the first illumination light 163 to the substrate W, and as a result, the wide band image 110 may be obtained by the image sensor 40 and the control unit 100. In the control unit 100, the wide band image 110 may be analyzed to examine or inspect whether there is a defect on the substrate W.

Referring to FIG. 16, the band selection part 130 may be configured to place the second band filtering part 184 on the optical axis 102, when the surface metrology process is performed on the substrate W. The second band filtering part 184 may be configured to obtain the second illumination light 183 from the spectrum of the illumination light 161. In some embodiments, the second band filtering part 184 may include a prism 186 and a slit structure 188. The second band filtering part 184 may be configured to provide the second illumination light 183 to the substrate W, and in this case, the narrow band images produced from the second illumination light 183 may be obtained by the image sensor 40 and the control unit 100. In the control unit 100, the narrow band images may be analyzed to obtain information on surface characteristics of the substrate W.

Figure 17:
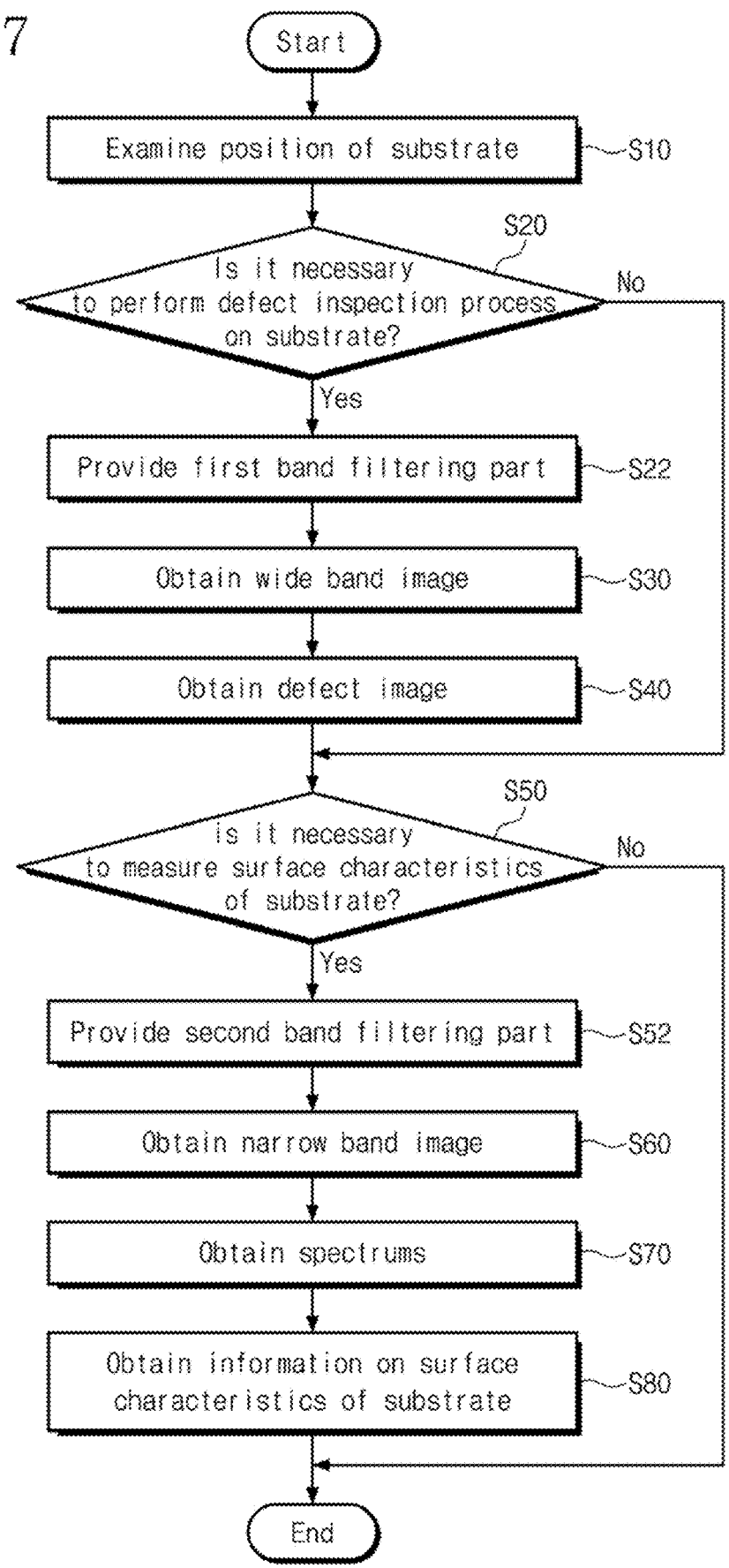
FIG. 17 is a flow chart illustrating an inspection/metrology method, which is performed using the inspection/metrology apparatus of FIGS. 15 and 16 according to some embodiments of the inventive concept.

FIG. 17 is a flow chart illustrating an example of an inspection/metrology method using the inspection/metrology apparatus 20 of FIGS. 15 and 16.

Referring to FIG. 17, the inspection/metrology method may include examining a position of the substrate W (in S10), determining whether it is necessary to perform the defect inspection process on the substrate W (in S20), providing the first band filtering part 164 (in 822), obtaining the wide band image 110 (in S30), obtaining the defect images 112 (in S40), obtaining information on surface characteristics of the substrate W (in S50), providing the second band filtering part 184 (in S52), obtaining narrow band images (in S60), obtaining spectrums (in S70), and obtaining information on surface characteristics of the substrate W (in S80).

First, if the substrate W is loaded on the stage 30, the control unit 100 may examine a position of the substrate W (in S10).

Next, the control unit 100 may determine whether it is necessary to perform the defect inspection process on the substrate W (in S20).

If the defect inspection process on the substrate W is required, the band selection part 130 may place the first band filtering part 164 on the optical axis 102 (in S22). If the defect inspection process on the substrate W is not required, the control unit 100 may determine whether it is necessary to perform the surface metrology process on the substrate W (in S50).

Thereafter, the control unit 100 may obtain the wide band image 110 using the first band filtering part 164 and the image sensor 40 (in S30). The first band filtering part 164 may provide the first illumination light 163 onto the substrate W. The first reflected light 65 reflected by the substrate W may be received by the image sensor 40 and may be used as the wide band image 110 in the control unit 100.

Next, the control unit 100 may obtain the defect images 112 from the wide band image 110 (in S40).

Thereafter, the control unit 100 may determine whether it is necessary to measure surface characteristics of the substrate W (in S50).

If the surface metrology process on the substrate W is required, the band selection part 130 may place the second band filtering part 184 on the optical axis 102 (in S52). If the surface metrology process on the substrate W is not required, the inspection/metrology process on the selected region of the substrate W may be terminated.

Thereafter, the control unit 100 may obtain the narrow band images using the second band filtering part 184 and the image sensor 40 (in S60). If the second band filtering part 184 provides the second illumination light 183 onto the substrate W, the image sensor 40 may receive the second reflected light 85 from the substrate W, and in the control unit 100, the received second reflected light 85 may be used as the narrow band images.

Next, the control unit 100 may analyze brightness intensities of pixels in each of the narrow band images to obtain the spectrums (in S70). The spectrums may be obtained from each point of the substrate W.

Thereafter, the control unit 100 may analyze the spectrums to obtain information on surface characteristics of the substrate W (in S80). For example, the control unit 100 may compare the spectrums with reference spectrums to obtain information on the surface characteristics of the substrate W.

According to some embodiments of the inventive concept, an inspection/metrology apparatus may include a first illumination light source, which is configured to provide a first illumination light of a first bandwidth onto a substrate, and a second illumination light source, which is configured to provide a second illumination light, whose wavelength is within a second bandwidth smaller than the first bandwidth, onto the substrate. The first illumination light may be used to obtain a wide band image, and the second illumination light may be used to obtain narrow band images. Using a control unit, the wide band image may be used to perform a defect inspection process on the substrate, and the narrow band images may be used to obtain information on surface characteristics of the substrate. The defect inspection process and the surface metrology process may be successively performed without a change in position of the examined substrate.

While example embodiments of the inventive concepts have been particularly shown and described, it will be understood by one of ordinary skill in the art that variations in form and detail may be made therein without departing from the spirit and scope of the attached claims.

What is claimed is:

1. An inspection/metrology apparatus, comprising:
a stage configured to load a substrate thereon;
a sensor provided on the stage;
an object lens provided between the sensor and the stage;
at least one light source generating an illumination light to be transmitted to the substrate through the object lens;
a first band filter provided between the at least one light source and the object lens and configured to control a wavelength of the illumination light within a first bandwidth; and
a second band filter provided between the at least one light source and the object lens and configured to control a wavelength of the illumination light within a second bandwidth smaller than the first bandwidth,
wherein the first band filter comprises an optical filter transmitting the illumination light to extract a first illumination light from the illumination light,
wherein the second band filter comprises a monochromator dispersing the illumination light to extract a second illumination light from the illumination light, and
wherein the monochromator comprises:
a prism producing a spectrum of the illumination light; and
a slit structure including a slit, wherein the slit structure is configured to allow a portion of the spectrum of the illumination light to pass therethrough.

2. The apparatus of claim 1, further comprising a band selector connected to the first and second band filters,
wherein the band selector is configured to selectively place one of the first and second band filters on an optical axis of the illumination light between the at least one light source and the object lens, depending on whether a current process is a defect inspection process or a surface metrology process.

3. The apparatus of claim 2, wherein the band selector comprises a plate driver.

4. The apparatus of claim 1, further comprising an imaging optical system, which is provided between the sensor and the object lens and is used to transmit a reflected light of the illumination light to the sensor, wherein the imaging optical system comprises:
an imaging aperture; and
an eye lens, which is provided between the imaging aperture and the sensor to allow the reflected light of the illumination light to be imaged on the sensor.

5. The apparatus of claim 4, wherein the imaging aperture comprises:
a first diaphragm; and
first and second imaging holes formed in the first diaphragm to allow the reflected light of the illumination light to pass therethrough.

6. The apparatus of claim 5, wherein the at least one light source comprises:
a first light source provided adjacent to the first band filter; and
a second light source provided adjacent to the second band filter.

7. The apparatus of claim 5, further comprising a first illumination optical system, which is provided between the first light source and the object lens and is used to transmit the illumination light to the substrate,
wherein the first illumination optical system comprises a first illumination aperture having a first illumination hole that is a same as a position and a shape of the first imaging hole.

8. The apparatus of claim 7, further comprising a second illumination optical system, which is provided between the second light source and the object lens and is used to transmit the illumination light to the substrate,
wherein the second illumination optical system comprises a second illumination aperture having a second illumination hole that is a same as a position and a shape of the second imaging hole.

9. An inspection/metrology apparatus, comprising:
a stage configured to load a substrate thereon;
an object lens provided on the stage;
an image sensor provided on the object lens;
an imaging lens provided between the image sensor and the object lens to allow an image of the substrate to be imaged on the image sensor;
a first illumination light source configured to provide a first illumination light having a first bandwidth onto the substrate;
a second illumination light source configured to provide a second illumination light, having a second bandwidth smaller than the first bandwidth, onto the substrate; and
a first illumination aperture disposed between the first illumination light source and the object lens to define a beam size of the first illumination light;
a second illumination aperture provided between the second illumination light source and the object lens to define a beam size of the second illumination light; and
an imaging aperture disposed between the imaging lens and the object lens to define a beam size of a first reflected light of the first illumination light.

10. The apparatus of claim 9, wherein the first illumination light source comprises an optical filter, and
the second illumination light source comprises a monochromator different from the optical filter.

11. The apparatus of claim 9, wherein the imaging aperture and the first and second illumination apertures include first to third center holes or first to third edge holes respectively.

12. An inspection/metrology method, comprising:
examining a position of a substrate;
determining whether it is necessary to perform a defect inspection process on the substrate;
providing an illumination light of a first bandwidth using an optical filter to the substrate to obtain a wide band image of the substrate, when the defect inspection process is required;
determining whether it is necessary to perform a surface metrology process on the substrate; and
providing an illumination light of a second bandwidth, which is smaller than the first bandwidth, to the substrate to obtain a plurality of narrow band images, when the surface metrology process is required,
wherein the second bandwidth is obtained by a monochromator including a prism producing a spectrum of the illumination light and a slit structure configured to selectively pass a portion of the spectrum of the illumination light.

13. The method of claim 12, further comprising placing a first band filter on an optical axis of the illumination light of the first bandwidth, when the defect inspection process is required.

14. The method of claim 13, further comprising placing a second band filter, which is different from the first band filter, on the optical axis of the illumination light of the second bandwidth, when the surface metrology process is required.

15. The method of claim 12, the defect inspection process comprising comparing an image captured using the illumination light of the first bandwidth to a reference image to obtain a defect image corresponding to a defect formed on the substrate.

16. The method of claim 12, the surface metrology process comprising:
obtaining spectrums corresponding to intensities of a plurality of images captured using illumination light of the second bandwidth at a relevant position; and
comparing the spectrums with a reference spectrum to obtain information on surface characteristics of the substrate.

* * * * *